(12) United States Patent
Liebermann et al.

(10) Patent No.: US 6,768,309 B2
(45) Date of Patent: Jul. 27, 2004

(54) ELECTRONIC BATTERY CONDITION TESTER

(76) Inventors: Leonard N Liebermann, 2644 Ellentown Rd., La Jolla, CA (US) 92037; Elliot T Gerard, 1920 NE. 118 Rd., Miami, FL (US) 33181

( * ) Notice: Subject to any disclaimer, the term of this patent is extended or adjusted under 35 U.S.C. 154(b) by 0 days.

(21) Appl. No.: 10/302,417

(22) Filed: Nov. 25, 2002

(65) Prior Publication Data

US 2004/0100266 A1 May 27, 2004

(51) Int. Cl.[7] .......................................... G01N 27/416
(52) U.S. Cl. .................................................... 324/426
(58) Field of Search ................................ 324/426, 428, 324/427, 429, 433, 436; 320/120; 340/636

(56) References Cited

U.S. PATENT DOCUMENTS

| | | | | |
|---|---|---|---|---|
| 4,719,428 A | | 1/1988 | Liebermann | ................ 324/427 |
| 4,816,768 A | | 3/1989 | Champlin | .................... 324/428 |
| 4,825,170 A | * | 4/1989 | Champlin | .................... 324/436 |
| 5,140,269 A | * | 8/1992 | Champlin | .................... 324/433 |
| 5,585,728 A | | 12/1996 | Champlin | .................... 324/427 |
| 5,610,511 A | * | 3/1997 | Parker | ........................ 324/106 |
| 5,773,978 A | * | 6/1998 | Becker | ....................... 324/430 |
| 5,914,605 A | | 6/1999 | Bertness | ..................... 324/427 |
| 6,037,778 A | | 3/2000 | Makhija | ..................... 324/427 |
| 6,172,505 B1 | * | 1/2001 | Bertness | ..................... 324/430 |

* cited by examiner

Primary Examiner—Pia Tibbits

(57) ABSTRACT

An electronic tester is disclosed that monitors the current capability of a storage battery without drawing heavy currents. It determines current capability from measurement of the battery's internal resistance is monitored in the conventional manner by drawing a small current load and observing the A.C. voltage generated at the battery terminals. The load circuit used here ensures that the current drawn is independent of battery resistance. The resistance signal is pocessed with a novel application of integrator circuitry to derive the battery's current capability.

9 Claims, 2 Drawing Sheets

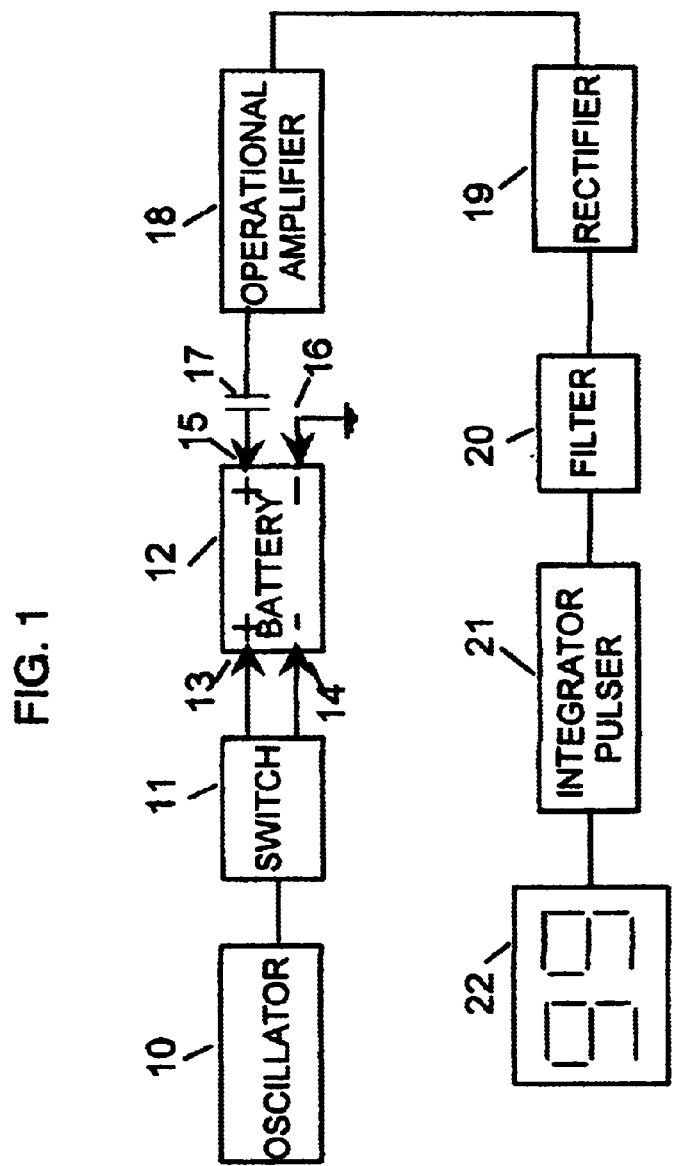

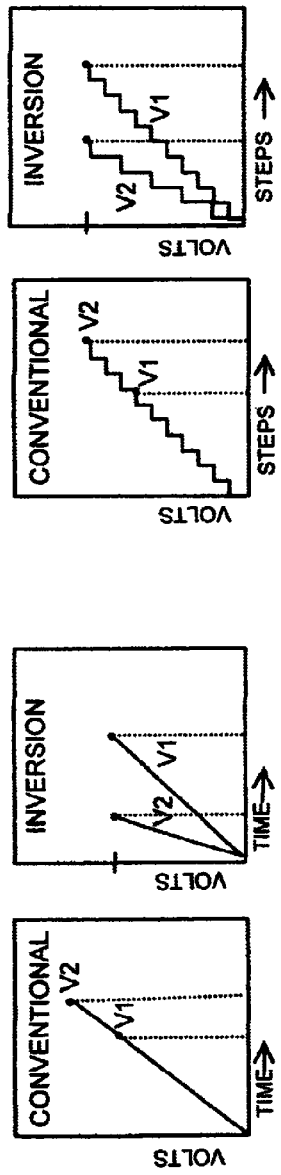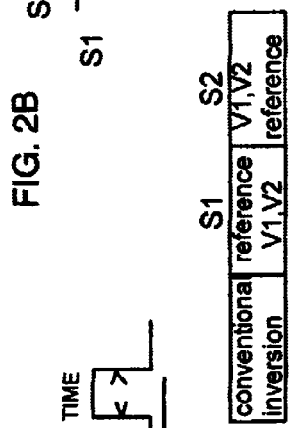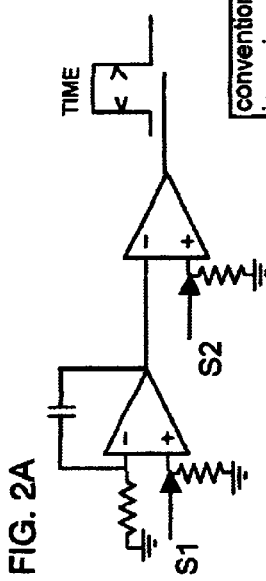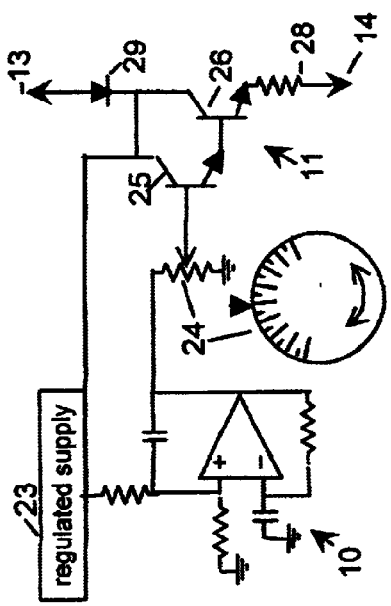
FIG. 2A
FIG. 2B
FIG. 3

ELECTRONIC BATTERY CONDITION TESTER

BACKGROUND OF THE INVENTION

Indication of battery condition generally requires testing the battery while drawing high current. For example, the commonly accepted test for specifying battery capability (Cold Cranking Amps) is defined by the Society of Auto Engineers (CCA test J537), wherein battery voltage drop is monitored after discharging at a specified constant high current for 30 seconds. This invention relates generally to battery testers and more particularly to electronic testing instruments that draw very little power from the battery, but derive results as if testing with high power drain.

Electronic battery testers have become accepted in the marketplace because of distinct advantages. In addition to their convenience as hand-held instruments without heavy cables, they are safer because the small currents drawn avoid dangerous sparks. Further, they do not require the battery to be fully charged in order to test nor will electronic battery testers weaken an already low battery. All electronic testers employ essentially similar basic technology to that described in U.S. Pat. No. 4,719,428 issued to Leonard Liebermann, on Jan. 12, 1988, whereby a small periodically switched test current is drawn from the battery. The resulting alternating voltage across the battery terminals is directly proportional to internal resistance. With use, a battery's internal resistance increases, and hence the observed alternating voltage increases. U.S. Pat. No. 4,719,428 amplifies the alternating voltage, converts it to steady D.C. and subtracts it from the total battery voltage. Battery output voltage drops while a large current is drawn, and that device indicates the expected voltage under these conditions.

Largely because of the SAE rating of batteries for their current capability, electronic battery testers have been developed to test current capability. The current capability is inversely proportional to the already discussed internal resistance. U.S. Pat. No. 4,816,768 discloses a circuit that provides an output that is inversely proportional to resistance and thus is indicative of current capability. That technology employs a feedback amplifier with the battery in the feedback loop. However with feedback technology as the battery resistance increases with use, the test load current is reduced proportionately. Typically, battery resistance increases by a factor 3 or 4 with use, before it needs replacement. Consequently a used battery may be tested with ⅓ or ¼ reduced load current, compared to testing when new. Battery resistance is unlike a metallic resistor and its observed value can vary with test current. In checking the decline of a battery with use it would be clearly preferable to test with the same test load, rather than the variation introduced with feedback technology.

BRIEF SUMMARY OF THE INVENTION

Broadly speaking, this invention provides a storage battery tester that tests the current capability of a battery, but does so without drawing large currents. As a consequence, no heavy cable leads, heavy contacting clips, nor high heat dissipating resistors are required. It can be hand-held and requires no internal batteries, deriving its power supply from the storage battery under test.

The small test current is drawn from the battery by a switching circuit connected across its terminals and controlled by an oscillator. When the oscillator reaches a certain point in its cycle, the switch turns on and the battery conducts a constant value of current of approximately 2 amperes at approximately 100 Hz. This test current is independent of the value of the internal resistance of the battery and will not change as the battery is used and its resistance increases. The remainder of the circuit measures the amplitude of the voltage across the battery terminals pursuant to the switching action of the oscillator. The voltage amplitude of the periodic signal is directly proportional to the internal resistance in the battery, and increased internal resistance results in increased voltage measured by the circuit. Hence it is the magnitude of the internal resistance that is the fundamental property whereby this invention monitors the battery's current capability.

Current capability of a battery is inversely proportional to its internal resistance. This invention teaches how to use integration circuitry to obtain a signal indicative of the inverse of resistance. This improvement over U.S. Pat. No. 4,719,428 represents a fundamental change in testing the battery. That patent provides a voltage value indicative of battery voltage that drops while a large current is drawn as the battery is used. That drop is directly proportional to resistance and hence the net battery voltage which diminishes with use, is a linear function of resistance. By contrast, this invention provides a current capability that also diminishes with usage, but is a parabolic function of internal resistance.

BRIEF DESCRIPTION OF THE SEVERAL VIEWS OF THE DRAWING

The objects, advantages and features of this invention will be more readily appreciated from the following detailed description when read in conjunction with the accompanying drawing, in which:

FIG. 1 is a block diagram of the battery condition tester of this invention illustrating the various components of the circuitry, FIG. 2 is an explanation of analog to digital conversion technology whereby an integrator circuit can be used to provide an output that is inversely proportional to the input voltage. FIG. 2A shows integration with a capacitor circuit and FIG. 2B shows integration with a resistor ladder circuit.

FIG. 3 is the oscillator and switch portion of the circuit shown in FIG. 1 that draws constant amplitude pulsed current from the battery, independent of internal battery resistance or contact resistance at the terminals.

DETAILED DESCRIPTION OF THE INVENTION

With reference now to the drawing, and more particularly to FIG. 1 thereof, there is shown oscillator 10 controlling switch 11, which is connected to the plus and minus terminals of battery 12, with respective connectors 13 and 14. The detection portion of the circuit is connected, separately and independently, to the battery plus and minus terminals with respective connectors 15 and 16. Capacitor 17 separates the AC component of the battery current which signal is then amplified by operational amplifier 18 in a conventional manner. This A.C. signal from the amplifier, that is representative of the internal resistance of the battery; is converted to steady D.C. with conventional active rectifier 19, and smoothed by filter 20. The integrator circuit 21 outputs a signal that is inversely proportional to the input D.C. signal and hence is representative of the current capability. Indicator 22 can be calibrated to show either a predicted current, or to a fraction (or percent) of the original battery current rating.

With respect to integrator circuit 22, FIG. 2 illustrates the fundamental elements of integration. A common application of integration is seen in analog to digital (A–D) conversion circuits. FIG. 2A shows integration using a capacitor in the conventional A–D application compared to integration with the circuit modified to provide inversion. In the conventional application the value of the constant charging current is a fixed circuit reference, and the time to charge the capacitor to the signal voltage is measured. In FIG. 2A, V1 and V2 are two different input signal voltages, with V2 greater than V1. In the conventional circuit the charging or integration time is directly proportional to the input signal voltage. Integration time is converted in the conventional manner to counts for digital presentation, or to voltage amplitude for analog indication Similarly, in FIG. 2B the ladder voltage steps are constant and the count number of steps to reach the signal voltage is directly proportional to the input signal.

In the inversion circuitry of this invention the same basic components of conventional integration circuitry are used, but are connected differently: In the FIG. 2A inversion example, the capacitor current is held constant while charging, but its value varies, being directly proportional to the input signal voltage (i.e. charging current for V2 greater than for V1). The maximum charged capacitor voltage is no longer variable, but is a fixed calibration constant. Now the integration time is inversely proportional to the signal with larger input signals (i.e. larger battery resistance) yielding shorter integration times. Similar results obtain for the FIG. 2B inversion graph, wherein the ladder voltage steps are proportional to the signal input. Hence the output from either circuit, when converted conventionally for use with a digital or analog indicator, can show battery current capability.

With reference now to FIG. 3, a conventional power supply regulator 23 derives a constant five volts from the battery for the circuit supply. Oscillator 10 functions in a conventional manner to output square waves of constant amplitude. The output of the oscillator connects to an adjustable resistor divider 24 and then to the input of a conventional Darlington configuration of transistors 25 and 26. When the Darlington circuit is connected to the respective plus and minus battery terminals it provides a conductive switch 11, through diode 29 and current sensing resistor 28, to draw test current from the battery. With this Darlington configuration the conductive current is governed entirely by the input voltage that can be selected with divider 24. As noted previously, for constant amplitude square waves, the current drawn from the battery is independent of internal battery resistance, and in addition is independent of any terminal contact resistance. A typical test current for automotive type storage batteries is 1 to 2 amperes.

In view of the above description, it is likely that modifications and improvements will occur to those skilled in the art that are within the scope of the appended claims.

What we claim as our invention:

1. A battery condition tester for a battery having positive and negative terminals, said battery condition tester comprising:
    means comprising a circuit for providing a constant current load between said terminals, and
    means for periodically switching said constant current, on and off, and
    means comprising a separate detection circuit including:
        amplifier means coupled to output positive and negative terminals to amplify the AC battery voltage resulting from the switched battery current;
        rectifier means for providing a DC voltage derived from said AC component of switched battery voltage;
        integrator circuit means for providing an output signal inversely proportional to the value of said DC voltage.
    indicator means responsive to said output signal.

2. The battery condition tester recited in claim 1 wherein said constant current load circuit comprises means for adjusting value of said load current including a current sensing resistor in the load circuit.

3. The battery condition tester recited in claim 1 wherein said constant current load is applied to said output positive and negative battery terminals with contacts which are separate from said coupling for said amplifier means.

4. The battery condition tester recited in claim 1 wherein said integrator circuit means include capacitor charging integration circuitry, resistor ladder integration circuitry.

5. The battery condition tester recited in claim 1, wherein said indicator means provide a numerical display with numbers proportional to said output signal.

6. The battery condition tester recited in claim 5 wherein said numbers are indicative of the battery's current capability, while drawing a large current.

7. The battery condition tester recited in claim 5 wherein said numbers are in fractional form, indicative of the battery's current capability, while drawing a large current, comparable to the battery's CCA rating.

8. The battery condition tester recited in claim 5 wherein said indicator means is a bar-graph display while the scale proportion to said output signal.

9. The battery condition tester recited in claim 2, wherein said load current adjustment is combined with an adjustment level indicator.

* * * * *